United States Patent
Wu

(10) Patent No.: US 8,295,094 B2
(45) Date of Patent: Oct. 23, 2012

(54) METHOD OF OPERATING NON-VOLATILE MEMORY CELL

(75) Inventor: Chao-I Wu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 13/168,536

(22) Filed: Jun. 24, 2011

(65) Prior Publication Data

US 2011/0255349 A1    Oct. 20, 2011

Related U.S. Application Data

(63) Continuation of application No. 12/326,283, filed on Dec. 2, 2008, now Pat. No. 7,986,558.

(51) Int. Cl.
    *G11C 11/34* (2006.01)

(52) U.S. Cl. ......... 365/185.18; 365/185.19; 365/185.29
(58) Field of Classification Search ............ 365/185.18, 365/185.19, 185.29
    See application file for complete search history.

(56) References Cited

U.S. PATENT DOCUMENTS

| | | | |
|---|---|---|---|
| 6,906,376 B1 * | 6/2005 | Hsu et al. | 257/315 |
| 7,672,159 B2 * | 3/2010 | Kuo et al. | 365/185.03 |
| 7,787,294 B2 * | 8/2010 | Kuo et al. | 365/185.03 |

* cited by examiner

*Primary Examiner* — Son Dinh
(74) *Attorney, Agent, or Firm* — J.C. Patents

(57) ABSTRACT

A method of operating a memory cell for 3D array of this invention is described as follows. Carriers of a first type are injected into a charge storage layer of the memory cell by applying a double-side biased (DSB) voltage to double sides of the memory cell. Carriers of a second type are injected into the charge storage layer by applying FN voltages.

15 Claims, 1 Drawing Sheet

METHOD OF OPERATING NON-VOLATILE MEMORY CELL

CROSS-REFERENCE TO RELATED APPLICATION

This is a continuation application of and claims the priority benefit of U.S. application Ser. No. 12/326,283, filed on Dec. 2, 2008, now allowed. The entirety of the above-mentioned patent application is hereby incorporated by reference herein and made a part of this specification.

BACKGROUND OF THE INVENTION

1. Field of the Invention

This invention relates to semiconductor devices, and more particularly relates to a method of operating a non-volatile memory (NVM).

2. Description of the Related Art

Nonvolatile memory has been widely used in many electronic products, wherein the most populated non-volatile memory devices are those having a charge storage layer and being written and erased electrically, such as EEPROM and flash memory.

Such a non-volatile memory is formed based on a bulk semiconductor substrate conventionally, with the charge storage layer disposed between a control gate and the substrate. Recently, nonvolatile memory formed based on a thin semiconductor film with the thin-film transistor (TFT) technology has been provided, wherein each cell is a thin-film transistor. By utilizing the TFT technology, it is possible to repeatedly form a semiconductor film and a layer of TFT cells based thereon and thereby fabricate a 3D non-volatile memory array.

A non-volatile memory cell of TFT type is conventionally programmed through positive Fowler-Nordheim (+FN) electron tunneling into the charge storage layer and erased by ejecting electrons out of the charge storage layer. For the efficiency of +FN programming is lower, the programming time required is longer generating more heat. This makes the operating method unsuitable to a 3D non-volatile memory array because a 3D memory array particularly suffers from difficult heat dissipation in the prior art.

SUMMARY OF THE INVENTION

In view of the foregoing, this invention provides a method of operating a non-volatile memory cell, which has a higher programming efficiency reducing the program time and heat generation and is therefore suitable for a 3D non-volatile memory.

The method of operating a memory cell for 3D array of this invention is described as follows. Carriers of a first type are injected into a charge storage layer of the memory cell by applying a double-side biased (DSB) voltage to double sides of the memory cell. Carriers of a second type are injected into the charge storage layer by applying FN voltages.

In an embodiment, the DSB voltage includes a DSB band-to-band tunneling hot carrier injection voltage.

In an embodiment, the FN voltage includes a positive FN (+FN) tunneling voltage.

In an embodiment, the carriers of the first type are electric holes and the carriers of the second type are electrons.

In an embodiment, the step of injecting the second type of carrier into the charge storage layer includes applying a first voltage to a control gate of the memory cell and applying a second voltage to a source and a drain of the memory cell. The first voltage is different from the second voltage such that FN tunneling of the second type of carrier into the charge storage layer is applied.

In an embodiment, the first voltage is higher than 0V and the second voltage is 0V.

In an embodiment, the first voltage ranges from 15 V to 20 V.

In an embodiment, the memory cell is a thin-film transistor (TFT), and the thin-film transistor includes a semiconductor layer, the charge storage layer and a control gate, where the semiconductor layer and the control gate both comprise doped silicon, and the charge storage layer includes two oxide layers and a nitride layer between the two oxide layers, so that the memory cell is a TFT SONOS cell.

A method of operating a memory cell for 3D array is provided. The method includes lowering a threshold voltage value of the memory cell by applying a DSB voltage to double sides of the memory cell and increasing the threshold voltage of the memory cell by applying FN voltage.

In an embodiment, the DSB voltage includes a DSB band-to-band tunneling hot carrier injection voltage.

In an embodiment, the FN voltage includes a positive FN (+FN) tunneling voltage.

In an embodiment, the step of increasing the threshold voltage of the memory cell includes applying a first voltage to a control gate of the memory cell and applying a second voltage to a source and a drain of the memory cell, wherein the first voltage is different from the second voltage such that the FN voltage is applied.

In an embodiment, the first voltage is higher than 0V and the second voltage is 0V.

In an embodiment, the first voltage ranges from 15 V to 20 V.

In an embodiment, the memory cell is a thin-film transistor (TFT), and the thin-film transistor includes a semiconductor layer, a charge storage layer and a control gate. The semiconductor layer and the control gate both comprise doped silicon, and the charge storage layer includes two oxide layers and a nitride layer between the two oxide layers, so that the memory cell is a TFT SONOS cell.

Since in this invention the memory cell is programmed with FN tunneling after being pre-erased with DSB injection, the programming efficiency is raised due to the charges of the opposite sign in the charge storage layer so that the time required for the programming is reduced. Moreover, because less heat is produced due to the shorter programming time, the operating method of this invention is particularly suitable for a 3D-memory array that suffers from the heat dissipation issue in the prior art.

It is to be understood that both the foregoing general description and the following detailed description are exemplary, and are not intended to limit the scope of the invention.

DESCRIPTION OF THE PREFERRED EMBODIMENTS

Figure 1:
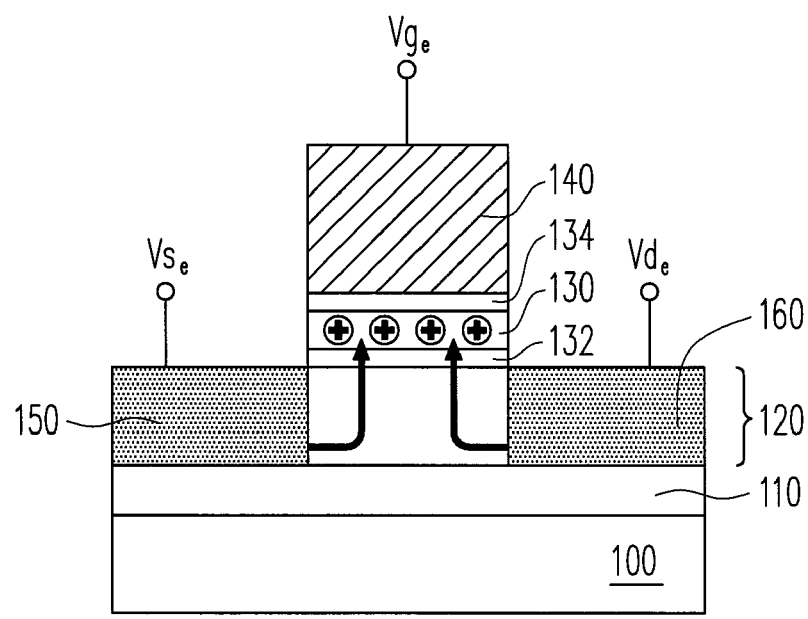
FIG. 1 illustrates the pre-erasing step in a method of operating a non-volatile memory cell according to an embodiment of this invention.
Figure 2:
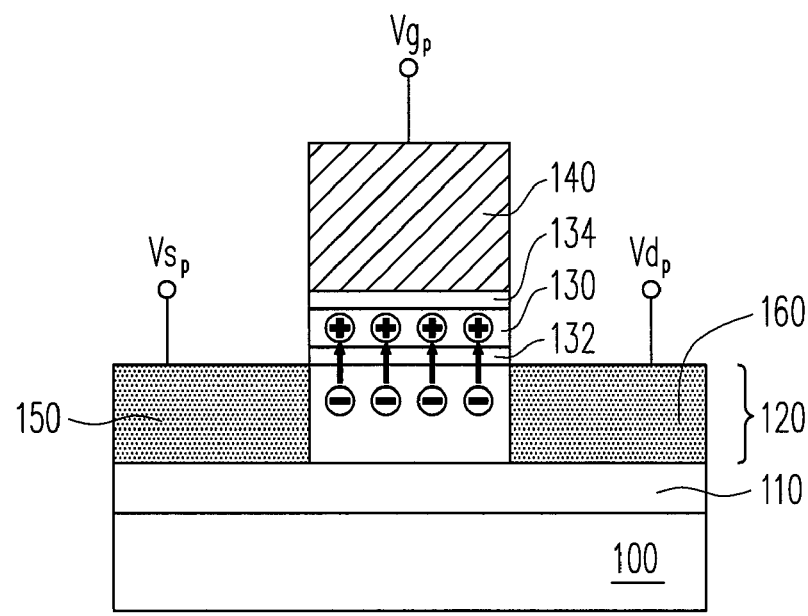
FIG. 2 illustrates the programming step in a method of operating a non-volatile memory cell according to an embodiment of this invention.

FIGS. 1 and 2 respectively illustrate the pre-erasing step and programming step in a method of operating a non-volatile memory cell according to an embodiment of this invention.

Referring to FIG. 1, the non-volatile memory cell includes a semiconductor layer 120 as a floating body disposed on an insulator 110 on a substrate 100, a charge storage layer 130 over the semiconductor layer 120, a control gate 140 over the charge storage layer 130, and a source region 150 and a drain region 160 in the semiconductor layer 120 beside the control gate 140.

The substrate 100 may be a silicon substrate. The insulator 110 may be a silicon oxide layer that is usually formed by CVD. The semiconductor layer 120 may be a doped polysilicon film formed by LPCVD. The charge storage layer 130 may be a charge trapping layer, which is usually a silicon nitride (SiN) layer between a bottom oxide layer 132 and a top oxide layer 134. The control gate 140 may include doped polysilicon. When the semiconductor layer 120 and control gate 140 include doped polysilicon and the charge storage layer 130 is a SiN trapping layer two oxide layers 132 and 134, the memory cell is a TFT SONOS cell.

In addition, it is possible that the semiconductor layer 120 under the control gate 140 is P-doped and the source region 150 and the drain region 160 are N-doped so that the cell is an N-type transistor, which is taken as an example in the descriptions below.

Referring to FIG. 1 again, in the pre-erasing step, a first voltage $Vg_e$ is applied to the control gate 140 and a second voltage $Vs_e(=Vd_e)$ to the source region 150 and the drain region 160 (double-side biased, DSB), wherein $Vg_e$ is sufficiently lower than $Vs_e$ ($Vd_e$) such that band-to-band tunneling hot hole (BTBTHH) injection into the charge storage layer 130 is caused. For example, the first voltage is lower than 0V and the second voltage higher than 0V. In such a case, it is possible that $Vg_e$ ranges from −10V to −20V and $Vs_e$ (=$Vd_e$) ranges from 8 V to 12 V. In a specific embodiment, $Vg_e$ is about −15V and $Vs_e$ (=$Vd_e$) about 10V.

Referring to FIG. 2, in the programming step, a third voltage $Vg_p$ is applied to the control gate 140 and a fourth voltage $Vs_p$ (=$Vd_p$) is applied to the source region 150 and the drain region 160, wherein $Vg_p$ is sufficiently higher than $Vs_p$ ($Vd_p$) such that +FN tunneling of electrons into the charge storage layer is caused. For example, $Vs_p$ (=$Vd_p$) is 0V and the third voltage is higher than 0V. In such a case, $Vg_p$ may range from 15 V to 20 V. In a specific embodiment, $Vg_p$ is about 20V.

On the other hand, the memory device according to this embodiment includes a memory cell as shown in FIG. 1/2, a first logic for pre-erasing the memory cell through DSB BTBTHH injection as in FIG. 1, and a second logic for programming the memory cell through +FN tunneling of electrons as in FIG. 2. The first logic might apply the above bias configuration for pre-erasing. The second logic might apply the above bias configuration for programming.

It is particularly noted that though this invention is exemplified by the operation of a TFT-type non-volatile memory cell in the embodiment, the operating method of this invention is also applicable to many other types of non-volatile memory cells having a charge storage layer, a control gate and source/drain regions, in consideration of the mechanisms of the DSB programming and FN-tunneling erasing. That is, the memory cell in the memory device of this invention is not limited to be a TFT-type NVM cell, but may alternatively be one of many other types of NVM cells.

Since in this embodiment the memory cell is programmed with electron FN tunneling after being pre-erased with DSB hole injection, the programming efficiency is raised due to the positive charge in the charge storage layer so that the time required for programming is reduced. Moreover, because less heat is produced due to the shorter programming time, the operating method of this invention is particularly suitable for a 3D-memory array that suffers from the heat dissipation issue in the prior art.

Furthermore, though the first type of carrier is electric hole, the second type of carrier is electron, the DSB injection includes DSB BTBTHH injection and the FN tunneling includes +FN tunneling of electrons in the above embodiment, this invention is not limited to the combination. In another embodiment, for example, the $1^{st}$ type of carrier is electron, the $2^{nd}$ type of carrier is electric hole, the DSB injection includes DSB electron injection and the FN tunneling includes FN tunneling of electric holes.

This invention has been disclosed above in the embodiments, but is not limited thereto. It is known to those of ordinary skill in the art that some modifications and innovations may be made without departing from the spirit and scope of this invention. Hence, the scope of this invention should be defined by the following claims.

What is claimed is:

1. A method of operating a memory cell for 3D array, comprising:
   injecting carriers of a first type into a charge storage layer of the memory cell by applying a double-side biased (DSB) voltage to double sides of the memory cell; and
   injecting carriers of a second type into the charge storage layer by applying FN voltages.

2. The method of claim 1, wherein the DSB voltage comprises a DSB band-to-band tunneling hot carrier injection voltage.

3. The method of claim 1, wherein the FN voltage comprises a positive FN (+FN) tunneling voltage.

4. The method of claim 1, wherein the carriers of the first type are electric holes and the carriers of the second type are electrons.

5. The method of claim 1, wherein the step of injecting the second type of carrier into the charge storage layer comprises applying a first voltage to a control gate of the memory cell and applying a second voltage to a source and a drain of the memory cell, where the first voltage is different from the second voltage such that FN tunneling of the second type of carrier into the charge storage layer is applied.

6. The method of claim 5, wherein the first voltage is higher than 0V and the second voltage is 0V.

7. The method of claim 6, wherein the first voltage ranges from 15 V to 20 V.

8. The method of claim 1, wherein the memory cell is a thin-film transistor (TFT), and the thin-film transistor comprises a semiconductor layer, the charge storage layer and a control gate, where the semiconductor layer and the control gate both comprise doped silicon, and the charge storage layer comprises two oxide layers and a nitride layer between the two oxide layers, so that the memory cell is a TFT SONOS cell.

9. A method of operating a memory cell for 3D array, comprising:
   lowering a threshold voltage value of the memory cell by applying a DSB voltage to double sides of the memory cell; and
   increasing the threshold voltage of the memory cell by applying FN voltage.

10. The method of claim 9, wherein the DSB voltage comprises a DSB band-to-band tunneling hot carrier injection voltage.

11. The method of claim 9, wherein the FN voltage comprises a positive FN (+FN) tunneling voltage.

12. The method of claim 9, wherein the step of increasing the threshold voltage of the memory cell comprises applying a first voltage to a control gate of the memory cell and applying a second voltage to a source and a drain of the memory cell, wherein the first voltage is different from the second voltage such that the FN voltage is applied.

13. The method of claim 12, wherein the first voltage is higher than 0V and the second voltage is 0V.

14. The method of claim 12, wherein the first voltage ranges from 15 V to 20 V.

15. The method of claim 9, wherein the memory cell is a thin-film transistor (TFT), and the thin-film transistor comprises a semiconductor layer, a charge storage layer and a control gate, wherein the semiconductor layer and the control gate both comprise doped silicon, and the charge storage layer comprises two oxide layers and a nitride layer between the two oxide layers, so that the memory cell is a TFT SONOS cell.

* * * * *